United States Patent

Pfander et al.

[11] Patent Number: 5,965,637
[45] Date of Patent: Oct. 12, 1999

[54] USE OF SILICONE-MODIFIED EPOXY RESINS AS SEALING COMPOUND

[75] Inventors: Werner Pfander, Fellbach; Irene Jennrich, Winnenden; Richard Spitz, Reutlingen; Uwe Koehler, Remseck; Siegfried Schuler, Engstingen, all of Germany

[73] Assignee: Robert Bosch GmbH, Stuttgart, Germany

[21] Appl. No.: 09/000,405

[22] PCT Filed: Jun. 5, 1996

[86] PCT No.: PCT/DE96/00993

§ 371 Date: Jun. 10, 1998

§ 102(e) Date: Jun. 10, 1998

[87] PCT Pub. No.: WO97/02321

PCT Pub. Date: Jan. 23, 1997

[30] Foreign Application Priority Data

Jun. 30, 1995 [DE] Germany .......................... 195 23 897

[51] Int. Cl.⁶ .......................... C08L 63/00; C08F 283/12; C08K 3/36
[52] U.S. Cl. .......................... 523/440; 523/425; 523/433; 523/443; 525/476; 524/492
[58] Field of Search ..................................... 523/425, 433, 523/440; 528/103.5; 525/476

[56] References Cited

U.S. PATENT DOCUMENTS

| | | |
|---|---|---|
| 3,849,187 | 11/1974 | Fetscher et al. . |
| 4,560,716 | 12/1985 | Sato et al. . |
| 4,701,482 | 10/1987 | Itoh et al. ................................ 523/435 |
| 4,859,722 | 8/1989 | Shiobara et al. ........................ 523/433 |
| 5,530,075 | 6/1996 | Morita et al. ............................ 525/476 |

FOREIGN PATENT DOCUMENTS

| | | |
|---|---|---|
| 0 379 464 B1 | 7/1990 | European Pat. Off. . |
| 0673957 | 9/1995 | European Pat. Off. . |
| 32 29 558 | 2/1984 | Germany . |
| 36 34 084 | 4/1988 | Germany . |
| 39 13 488 | 10/1990 | Germany . |

*Primary Examiner*—Tae Yoon
*Attorney, Agent, or Firm*—Kenyon & Kenyon

[57] ABSTRACT

The use of a thermosetting epoxy resin blend as a casting compound for electronic or electrotechnical components. The blend contains a silicone-modified epoxy resin in which organic components containing epoxy groups are chemically bonded to silicone components, and a mineral filler, optionally silanized, that regulates the thermal expansion behavior, in an amount of 40 wt % to 75 wt %, based on the thermosetting epoxy resin blend. The thermosetting epoxy resin blends are used to particular advantage for casting diodes.

8 Claims, No Drawings

USE OF SILICONE-MODIFIED EPOXY RESINS AS SEALING COMPOUND

BACKGROUND INFORMATION

Use of casting compounds based on epoxy resins for encapsulating or coating electric or electronic components is known. Examples of such components include high-voltage ignition coils, electronic circuits or semiconductor elements such as diodes, silicon wafer chips or sensors. The casting compounds must comply with many different requirements in different combinations, depending on the application. In particular these casting compounds should:

- have good flow properties at conventional processing temperatures, i.e., at room temperature and elevated temperatures up to approximately 80° C., to permit mass production with short cycle times;
- be able to withstand high thermal stresses, i.e., have the highest possible glass transition temperature;
- adhere well to the substrates even with frequent temperature changes, in which regard a low coefficient of thermal expansion and a high internal flexibility can make a contribution;
- have good dielectric properties, in particular low dielectric losses, and a high dielectric strength, at least when used in the high-voltage range, for which purpose they should be free of ionic impurities as much as possible and should have low alkali content in particular;
- be resistant to various environmental influences at ambient temperature and optionally at high operating temperatures, e.g., resistant to fuels, oils and salt spray as well as oxidative degradation due to atmospheric oxygen; and
- provide effective corrosion protection for metallic substrates.

U.S. Pat. No. 3,849,187 describes encapsulating agents for transistors and other semiconductor elements that contain an epoxy resin and an amine, a phenolic novolak resin or a carboxylic anhydride hardener plus 0.1% to 5% of an added alkylalkoxysilane having two or three low alkoxy groups and one amino or epoxy group in the alkyl moiety. The silane should improve the insulation properties and endurance of the encapsulating agent and should make pretreatment or passivation of the transistor or semiconductor element superfluous. One disadvantage of these encapsulating agents is their poor thermal cycling behavior due to their greater brittleness.

German Patent No. DE 32 29 558 describes impregnating casting compounds for electric components consisting of an epoxy resin based on bisphenol A and a cycloaliphatic epoxy, a modified dicarboxylic anhydride hardener, an imidazole accelerator and a chalk filler. These impregnating compounds are not fully satisfactory because of their relatively low glass transition temperature, relatively high coefficient of thermal expansion and relatively low flexibility. Therefore, the cured impregnating compounds tend to shrink, crack and adhere poorly.

German Patent No. DE 39 13 488 describes casting compounds for electric and electronic components containing a cycloaliphatic epoxy resin having a low viscosity and the following formula:

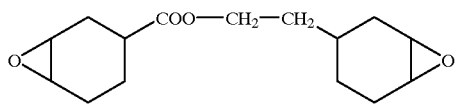

or a certain polyfunctional epoxy novolak resin; methylene-endo-methylenetetrahydrophthalic anhydride (also called methylnadic anhydride) as the hardener; a curing accelerator based on imidazole; amorphous silicon dioxide, optionally pretreated with an epoxysilane and having a certain particle size; a coloring agent and finally hollow glass beads as a filler. When used for components exposed to high stresses, the long-term thermal properties of the impregnating compounds and the thermal cycling behavior are inadequate.

These known casting compounds based on epoxy resins are free of silicone compounds. U.S. Pat. No. 4,560,716 discloses epoxy resin blends containing (a) an epoxy resin, (b) a hardener, (c) an additive to prevent rust such as dithiophosphoric acid, certain dithiophosphoric acid derivatives and/or certain metal salts of dithiocarbamic acids or oxidized waxes. These epoxy resin blends (d) may also contain a second additive having an alkylarylsilsesquioxane and/or an organosiloxane polymer. The following general formula is given for the alkylarylsilsesquioxane:

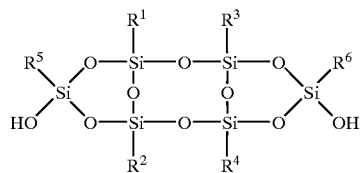

where $R^1$ through $R^6$ may be the same or different and denote alkyl, aryl, alkenyl or aralkyl groups. The organosiloxane polymers should conform to the general formula:

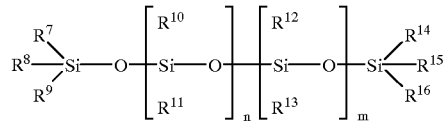

where $R^1$ through $R^{16}$ stand for alkyl, aryl, alkenyl, alkaryl groups, hydrogen or a hydroxyl group, and n and m stand for 0 or an integer of 1 or higher. The above-mentioned publication thus describes epoxy resin blends containing cyclic or open-chain silicone resins but not containing elastomeric polyorganisiloxane compounds. These epoxy resin blends are recommended for use as encapsulating materials for electric components. Their rust-preventing effect is based on the fact that after encapsulation, additives which do not react with the epoxy resin migrate to the surface of the encapsulated component, where they form a rust-preventing film. The organosilicon materials named as optional additives also prevent the loss of electric insulation properties.

German Patent No. DE 36 34 084 discloses a modified reaction resin blend that can be processed to thermoset plastics resins and may contain an epoxy resin as the reaction resin and also three-dimensionally cross-linked polyorganosiloxane rubbers in the form of particles with a diameter of 0.01 to 50 μm having reactive groups at their surface which react chemically with the reaction resin, optionally in the presence of additives which serve as reaction mediators. According to this publication, these reaction resin blends are suitable in particular for production of optionally molded, high-impact thermoset plastics with good fracture toughness, fiber-reinforced plastics, insulation materials in electrical engineering and molded laminates. However, they are not recommended as casting compounds for electronic or electrotechnical components.

SUMMARY OF THE INVENTION

Using curable epoxy resin blends containing silicone-modified epoxy resins as casting compounds for electronic and electrotechnical components according to the present invention yields advantages with regard to the processing technology on the one hand and the performance and properties of the cured casting compounds and the respective cast components on the other hand. This is true in particular of use as a casting compound for casting electronic components based on semiconductors, such as chips and diodes, where a great internal flexibility is more important than impact strength or fracture toughness.

The modified epoxy resin blends according to the present invention have a viscosity low enough for rapid processing even without being diluted with solvents; at the usual processing temperatures of up to approximately 80° C., the viscosity is generally lower than 50,000 mPa·s. Therefore, they are also suitable for large-scale production because the curing times are short, i.e., they may be only 10 to 120 minutes, depending on the temperature. After final curing, the casting compounds provide excellent protection for the encapsulated components against environmental influences, including corrosion due to moisture. The latter is noteworthy, because the casting compounds according to the present invention need not contain any film forming agents, which are supposed to prevent rusting in the encapsulating agents according to U.S. Pat. No. 4,560,716, and the silicone components of the silicone-modified epoxy resins are chemically bonded to their organic components which contain epoxy groups, i.e., they are immobilized. Thus, these silicone components cannot become active in the same manner as the organosilicon compounds that are present in the encapsulating materials according to U.S. Pat. No. 4,560,716 and are not chemically bonded to the epoxy resin and therefore can migrate to the surface of the encapsulated component, where they manifest their anticorrosion effect (column 9, lines 44 through 60).

The epoxy resin blends that contain silicone-modified epoxy resins and are used according to the present invention have, when cured, high glass transition temperatures, e.g., up to 220° C., and they have the required dielectric properties even at temperatures approaching the glass transition temperatures. They have a low coefficient of thermal expansion, especially with an appropriate choice of the type and amount of mineral fillers, and therefore have little or no tendency to shrink and crack with changes in temperature and they have excellent substrate adhesion even with frequent temperature changes. The cured casting compounds are also resistant to environmental influences over long periods of time, even at higher operating temperatures, so they have an excellent resistance to atmospheric oxygen as well as to fuels, oils and salt sprays. The epoxy resin blends modified by elastomeric silicone polymers are used to particular advantage as casting compounds for diodes of generators.

DETAILED DESCRIPTION

The advantages described here are achieved by using thermosetting epoxy resin blends containing a silicone-modified epoxy resin and a mineral filler as the casting compounds.

An essential feature of the present invention is that the epoxy resin blends used as casting compounds must contain a silicone-modified epoxy resin in which organic components containing epoxy groups are chemically bonded to silicone components. The silicone components may be elastomeric silicone polymers in the form of particles with particle sizes of 1 to 25 μm, preferably 1 to 20 μm. Such a silicone-modified epoxy resin may also be referred to as a particulate elastomeric polyorganosiloxane with chemically bonded epoxy groups at the surface. Chemical bonding may be accomplished directly by reacting a reactive group of the epoxy resin with reactive groups present on the surface of the silicone particle. As an alternative, it may also be created by bridge molecules whose reactive groups react with reactive groups on the surface of the silicone particles as well as in the epoxy resin molecules. Silicone-modified epoxy resins of the type described here and their synthesis are described in the above-mentioned German Patent No. 36 34 084 and are available from the patent holder, Hanse Chemie GmbH.

Another variant of the silicone-modified epoxy resins in which organic components containing epoxy groups are chemically bonded to silicone components inside a molecule involves silicone block copolymers containing one or more polyorganosiloxane blocks and one or more organic blocks which have the epoxy groups and are chemically bonded to the silicone blocks in a suitable manner, e.g., by ether bridges or carbonic ester groups. Examples include silicone-modified epoxy resins having the formula:

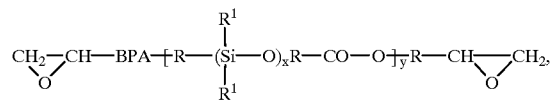

where BPA denotes a residue of a bisphenol A molecule, R is a divalent organic moiety, such as an ethylene or propylene group, and $R^1$ is a low alkyl group, e.g., a methyl group, and x and y each denote an integer. Silicone block copolymers of the type described here are known and are likewise available from Hanse Chemie GmbH.

In addition to the silicone-modified epoxy resins, other conventional epoxy resins may also be used. Suitable examples include in particular the known epoxy resins based on polyvalent aromatic or cycloaliphatic hydroxyl compounds. Examples of derivatives of aromatic hydroxyl compounds that can be mentioned include the glycidyl ethers of bisphenol A or bisphenol F and phenol-novolak resins or cresol-novolak resins. Usable cycloaliphatic epoxy resins include, for example, bis-epoxidized 1,2,3,6-tetrahydrobenzoate beta-1',2',3',6'-tetrahydrophenylethyl ester, hexahydro-o-phthalate bis-glycidyl ester, etc. Aliphatic epoxy resins such as 1,4-butanediol diglycidyl ether are also suitable for use as additional epoxy resins.

The silicone content of the epoxy resin blends used according to present invention—whether as particulate elastomeric silicone polymers bonded chemically to organic residues containing the epoxy groups or in the form of siloxane blocks in silicone block copolymers—is preferably 5 wt % to 40 wt %, in particular 10 wt % to 20 wt %, based on the silicone-modified epoxy resin and optionally the additional epoxy resin which is also used. If the silicone content is lower than this, the favorable product properties are impaired and in particular the desired internal flexibility of the cured epoxy resin blends is reduced.

Another essential feature of the epoxy resin blends used according to the present invention is their mineral filler content. The functional properties of the epoxy blends can be varied through the choice of the mineral fillers. Amorphous silicon dioxide has proven especially suitable when used for casting electronic components based on semiconductors and diodes in particular. This is electrically fused silicic acid reduced to a suitable size. Other suitable mineral fillers include powdered quartz, aluminum oxide and dolomite (see, for example, Kunststoffe (Plastics), 72 (1982), pp. 228 ff.). The mineral fillers may be silanized in a known way to improve their wettability by the epoxy resin. In general, they have an average particle diameter of 3 to 30 μm, and they may have a wide or narrow particle size distribution spectrum. They are preferably used in amounts of 40 wt % to 75 wt %, in particular 50 wt % to 65 wt %, based on the total weight of epoxy resin(s) and optional hardener.

The epoxy resin blends may be self-curing according to an ionic mechanism without any additional hardener. In addition to the epoxy resin, they contain an initiator, such as a sulfonium salt (e.g., European Patent No. EP 379,464). As a rule, however, they contain one of the known hardeners which react with the epoxy resin in a chain-forming or cross-linking reaction, e.g., a hardener such as a polyvalent carboxylic acid, an anhydride of a polyvalent carboxylic acid or a polyvalent amine. Especially suitable hardeners are the diene addition products of olefinically unsaturated dicarboxylic anhydrides such as maleic anhydride and dienes, in particular cyclic dienes such as cyclopentadiene and methylcyclopentadiene. Epoxy resin blends cured with these carboxylic anhydrides have especially high glass transition temperatures.

The epoxy resin and the hardener are preferably used in approximately equivalent amounts. The functional properties of the epoxy resin blend can be optimized with a slight, e.g., a 10%, molar excess of one component or another.

The epoxy resin blends used as casting compounds according to the present invention may also contain other conventional additives. These include curing accelerators such as tertiary amines or imidazole, pigments, carbon black, dyestuff pastes, flow control agents, sedimentation inhibitors, foam suppressants and/or bonding agents, which may be added in the usual amounts.

The epoxy resin blends used according to the present invention are synthesized and processed in the usual way. When blends are cured with a hardener and are not to be processed immediately, it is advisable to produce and store them as a two-component system. To do so, the silicone-modified epoxy resin, optional unmodified epoxy resin and filler (or part thereof) may be mixed to form a first component and the hardener, optionally a curing accelerator, additional filler and/or one or more of the above-mentioned additives may be mixed to form a second component. Then the two components are in turn blended for processing until achieving a homogeneous blend suitable for use as a casting compound. Conventional mixing equipment having an adequate shearing action on the ingredients or components are suitable for all mixing operations and include static mixing tubes, flow-through mixers or oscillating mixers. The mixing operations can be carried out at room temperature or at a moderately elevated temperature, e.g., up to approximately 80° C. The castable blend may then be used in the usual way, e.g., in a casting method for insulation of diodes. Depending on the design of the installation, one or more casting jets are available for this purpose.

EXAMPLE

A casting compound is produced by blending the following components in a static mixing tube until homogeneous:
75 parts by weight hexahydrophthalate bis-glycidyl ester of the formula

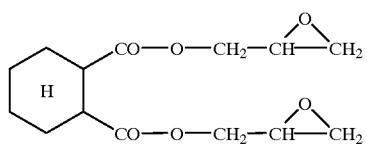

with an epoxy content of 6.5 to 7.0 eq/kg, a viscosity of 800 to 1050 mPa•s at 25° C. and a density of 1.20 to 1.24 g/cm³ at 25° C.;
25 parts by weight hexahydrophthalate bis-glycidyl ester modified with 40 wt % silicone particles with an average particle diameter of 10 μm, synthesized according to German Patent No. DE 36 34 084;
105 parts by weight methylnadic anhydride as hardener;
1 part by weight imidazole as accelerator;
330 parts by weight amorphous quartz powder with an average particle diameter of 20 μm.

Diodes for generators were cast using this blend as the casting compound. The diodes were heated for one hour at 100° C. and for another hour at 200° C. to cure the casting compound. The cured casting compound had the following properties:
linear shrinkage: 0.02%/K
glass transition temperature ($T_g$): 210–215° C.
coefficient of thermal expansion:
 below $T_g$ ($10^{-6}$/K):25–30
 above $T_g$ ($10^{-6}$/K):90–100
chloride: <10 ppm
alkali metals: <2 ppm

What is claimed is:

1. A casting compound for an electrical component, the casting compound comprising a thermosetting epoxy resin blend containing:

a first epoxy resin having a chemically bonded linear organopolysiloxane group, the first epoxy resin being an elastomer, the first epoxy resin having at least one bifunctional bridge molecule with at least one oxygen-containing group between a functional oxirane group and the linear organopolysiloxane group;

a second epoxy resin based on at least one of the group consisting of a polyvalent aromatic group and a cycloaliphatic group;

a hardener; and a mineral filler.

2. The casting compound according to claim 1, wherein the bifunctional bridge molecule is selected from the group consisting of bisphenol A and bisphenol F, and a bifunctional bridge molecule fragment is selected from the group consisting of —CH$_2$ CH$_2$ COO— and —CH$_2$ CH$_2$ CH$_2$ COO—.

3. The casting compound according to claim 1, wherein the second epoxy resin contains a hexahydrophthalate bisglycidyl ester.

4. The casting compound according to claim 1, wherein the mineral filler contains an amorphous silicon dioxide.

5. The casting compound according to claim 4, wherein a content of the amorphous silicon dioxide is in a range of 40–75 wt %.

6. The casting compound according to claim 1, wherein the hardener is a diene addition product of an olefinically unsaturated dicarboxylic anhydride and a cyclic diene.

7. The casting compound according to claim 1, wherein the epoxy resin blend further contains an initiator for cationic cross-linking of the first epoxy resin.

8. The casting compound according to claim 1, wherein the epoxy resin blend further contains at least one of the group consisting of a curing accelerator, pigments, a carbon black dyestuff paste, sedimentation inhibitors, foam suppressants, and bonding agents.

* * * * *